(12) United States Patent
Fedi et al.

(10) Patent No.: US 12,322,604 B2
(45) Date of Patent: Jun. 3, 2025

(54) METHOD FOR MANUFACTURING AN ELECTRONIC POWER MODULE USING POLYMER PREFORMS

(71) Applicant: SAFRAN, Paris (FR)

(72) Inventors: Baptiste Joël Christian Fedi, Moissy-Cramayel (FR); Rabih Khazaka, Moissy-Cramayel (FR); Toni Youssef, Moissy-Cramayel (FR); Pierre Jean Sallot, Moissy-Cramayel (FR)

(73) Assignee: SAFRAN, Paris (FR)

( * ) Notice: Subject to any disclaimer, the term of this patent is extended or adjusted under 35 U.S.C. 154(b) by 878 days.

(21) Appl. No.: 17/609,596

(22) PCT Filed: Apr. 24, 2020

(86) PCT No.: PCT/FR2020/050709
§ 371 (c)(1),
(2) Date: Nov. 8, 2021

(87) PCT Pub. No.: WO2020/225499
PCT Pub. Date: Nov. 12, 2020

(65) Prior Publication Data
US 2022/0230891 A1  Jul. 21, 2022

(30) Foreign Application Priority Data
May 6, 2019  (FR) ..................... 1904735

(51) Int. Cl.
*H01L 21/48*    (2006.01)
*H01L 23/367*   (2006.01)
(Continued)

(52) U.S. Cl.
CPC ...... *H01L 21/4857* (2013.01); *H01L 23/3675* (2013.01); *H01L 23/49822* (2013.01);
(Continued)

(58) Field of Classification Search
CPC .......... H01L 21/4857; H01L 23/3675; H01L 23/49822; H01L 23/49838
See application file for complete search history.

(56) References Cited

U.S. PATENT DOCUMENTS 5,716,760 A * 2/1998 Juskey ................ H05K 3/3452
430/315
2011/0247865 A1* 10/2011 Tsurumi ............... H05K 3/4661
174/255

(Continued)

FOREIGN PATENT DOCUMENTS

| DE | 10 2012 200325 A1 | 3/2013 |
| FR | 3 060 846 A1 | 6/2018 |
| FR | 3 061 989 A1 | 7/2018 |

OTHER PUBLICATIONS

International Patent Application No. PCT/FR2020/050709, International Search Report and Written Opinion dated Sep. 22, 2020, 18 pgs.

(Continued)

*Primary Examiner* — Michael Jung
(74) *Attorney, Agent, or Firm* — Cozen O'Connor

(57) ABSTRACT

The invention relates to a method for manufacturing a power electronic module (1) by additive manufacturing, characterized in that it comprises the steps of:
  making or fixing preforms (15) of polymer material on at least one face of an insulating substrate (2a) covered with at least one layer of metal (2b, 2c), referred to as a metallized substrate (2),
  depositing a first metal layer (17) on the preform (15),
  depositing by electroforming a second metal layer (18) on the first metal layer (17).

13 Claims, 3 Drawing Sheets

(51) Int. Cl.
*H01L 23/498* (2006.01)
*B33Y 10/00* (2015.01)
*B33Y 80/00* (2015.01)
*H01L 23/00* (2006.01)

(52) U.S. Cl.
CPC ........ *H01L 23/49838* (2013.01); *B33Y 10/00* (2014.12); *B33Y 80/00* (2014.12); *H01L 24/48* (2013.01); *H01L 2224/48137* (2013.01); *H01L 2924/3512* (2013.01)

(56) References Cited

U.S. PATENT DOCUMENTS

| | | | | |
|---|---|---|---|---|
| 2012/0068359 | A1* | 3/2012 | Mori | H01L 24/82 257/774 |
| 2017/0040249 | A1* | 2/2017 | Yanagisawa | H05K 1/111 |
| 2018/0120037 | A1* | 5/2018 | Campbell | F28F 21/067 |
| 2020/0294883 | A1* | 9/2020 | Dede | H01L 23/3107 |

OTHER PUBLICATIONS

French Application No. 1904735; Search Report dated Feb. 4, 2020; 8 pgs.

* cited by examiner

METHOD FOR MANUFACTURING AN ELECTRONIC POWER MODULE USING POLYMER PREFORMS

CROSS-REFERENCE TO RELATED APPLICATIONS

This application is a 35 U.S.C. § 371 filing of International Application No. PCT/FR2020/050709 filed Apr. 24, 2020, which claims the benefit of priority to French Patent Application No. 1904735 filed May 6, 2019, each of which is incorporated herein by reference in its entirety.

TECHNICAL FIELD OF THE INVENTION

The invention relates to a method for manufacturing an electronic power module by additive manufacturing, as well as to an electronic power module obtained using such a method.

The present invention has a particular application in the field of aeronautics where thermal stresses can be severe.

PRIOR ART

Power electronic modules are used in converters required for the electrification of propulsive and non-propulsive systems on board aircraft in order to convert the electrical energy from the main grid (115V AC, 230V AC, 540V DC) into several forms (AC/DC, DC/AC, AC/AC and DC/DC).

FIG. 1 illustrates a power electronic module 1 of the prior art. This comprises a substrate 2 comprising an electrically insulating layer 2a of ceramic material, coated on each of its opposite faces with a metal layer 2b, 2c. Such an assembly is called a metallized substrate 2.

The top metal layer 2b forms a power circuit on which power semiconductor components 3 are assembled. The power electronic module 1 comprises an electrical and/or mechanical interconnection joint 4 through which the power semiconductor components 3 and connectors 5 are assembled to the power circuit. Due to their imperfections, power semiconductor components 3 are subject to Joule effect losses and therefore represent a significant source of heat.

The power semiconductor components 3 are electrically interconnected with each other and with the connectors 5 by means of the wiring wires 6. A housing 7, generally made of polymer, is glued with an adhesive seal 8 to the substrate 2 or to a metal base 9 on which the substrate 2 is arranged. The housing 7 is filled with an encapsulant 10, such as a gel or epoxy, to provide mechanical and electrical protection for the power components 3 and the wiring wires 6.

The lower metal layer 2c of the substrate 2 is attached to the metal base 9, which has the function of spreading the heat flow and providing a thermal connection to a metal heat sink 11. As illustrated in FIG. 1, the power electronic module 1 comprises an electrical and/or mechanical interconnection joint 12 through which the lower metal layer 2c of the substrate 2 is bonded to the base 9.

The base 9 is itself bonded to the heat sink 11 via a layer 13 of thermal interface material, such as thermal grease, elastomeric film, or phase-change materials. The layer 13 of thermal interface material reduces the contact thermal resistance between the base 9 and the heat sink 11 to ensure better heat flow evacuation. The heat sink 11, is provided with fins 14 allowing to further reduce the thermal resistance of the latter, the fins 14 being traversed by a cooling fluid, for example, air.

Such a stack of layers has several limitations when used at high temperatures.

A first limitation is the high thermal resistance due to the thermal interface material 13, especially in the case where a soft thermal interface material is used (e.g. thermal grease), and to the various interfaces separating the power component 3 and the coolant.

A second limitation is related to high temperature instability, limited in particular by the operating temperature of the thermal interface 13 (of the order of 50° C. in the case of thermal grease).

A third limitation is the limited reliability of the assembly due to the thermal fatigue phenomenon, because of the difference between the thermal expansion coefficients of the materials. When using rigid interface materials, this fatigue is a source of propagation of cracks in the solder joint, particularly between the substrate 2 and the base 9 and between the base 9 and the heat sink 11.

Solutions based on the direct cooling of the metallized substrate by a fluid are proposed in the literature, but these present limitations at the level of the exchange surface in particular.

In order to overcome these disadvantages, the document FR 3 061 989, in the name of the Applicant, proposes to use additive manufacturing by melting a powder bed for the production of the heat sink of the case and the electrical connectors directly and respectively on the lower and upper face of the metallized substrate. This technique reduces the thermal resistance of the assembly and limits the assembly steps. However, the melting of the metal powder bed requires quite high temperatures locally during the process, leading to high residual stresses. These stresses can lead, in some geometries, to the cracking of the ceramic layer of the metallized substrate. Moreover, the high temperature generated by this process limits the choice of substrates to metallized ceramics. Furthermore, it is not possible to produce elements by additive manufacturing simultaneously on both opposite sides of the substrate, so that operator intervention is required to turn the substrate over.

DISCLOSURE OF THE INVENTION

The invention aims to remedy such drawbacks in a simple, reliable and inexpensive way.

To this end, the invention relates to a method for manufacturing a power electronic module by additive manufacturing, characterized in that it comprises the steps of:
  making or fixing preforms of polymer material on at least one face of an insulating substrate covered with at least one layer of metal, called a metallized substrate,
  depositing a first metal layer on the preform,
  depositing by electroforming a second metal layer on the first metal layer.

The manufacturing method can be carried out on a metallized insulating substrate in order to obtain cooling, electrical connection and/or mechanical protection elements of a power electronic module by additive manufacturing.

Such a method can allow several elements to be produced in parallel (radiator, housing and power connectors, for example).

For a single power electronic module, all of the above elements or combinations or groups of elements can be printed simultaneously or successively using the described process.

Preforms can be made by additive manufacturing. The preforms can be made or fixed on at least two opposite sides of the metallized substrate.

The second layer can have a thickness of between a few microns and a few millimetres, depending on the requirements. The thickness of the second layer can be varied as a function of the voltage applied and the bias time applied during the electroforming deposition step.

During electroforming, all or part of the metal substrate and the first metal layer may be immersed in an electrolytic bath containing metal ions, for example copper in ionic form. An electrode is electrically connected to the first metal layer, an electrical potential being applied to said electrode so as to deposit the filler metal of the electrolytic bath on the first metal layer. The non-metallic areas of the substrate that are not at electrode potential are then not covered with filler metal.

The process may include a step of dissolving the polymeric preforms chemically or thermally. This makes it possible to create recessed areas, connectors or channels in the resulting power electronics module. In particular, the channels can facilitate heat exchange for cooling the assembly, for example by means of a cooling air flow or a liquid coolant.

The method may include a step of assembling active components, such as semiconductor power components, onto the metallized substrate.

The active component can be bonded to the metallized substrate by sintering, bonding or sintering.

At least two active components can be connected to each other by wires.

The process may include a step of protecting at least one area of the metallized substrate prior to deposition of the first metal layer.

The area to be protected can be covered with a film made of polymer, for example. The said film can be removed during the dissolving step of the preforms.

The metallized substrate may include at least one ceramic insulating layer.

The metal layer(s) of the metallized substrate can be joined to the insulating layer by Active Metal Brazing (AMB), Direct Bonded Copper (DBC), or Direct Bonded Aluminium (DBA).

The insulating layer may also be a polymer layer.

The first metal layer may be less than 5 microns thick, preferably less than 1 micron.

The first metal layer can be deposited on the preform by chemical reduction via spraying.

The power electronic module may comprise a housing in which the metallized substrate and the active component are housed, the method comprising a step of filling the housing, at least in part, with an electrically insulating material.

The insulating material is, for example, a gel based on silicone or epoxy resin.

The invention also relates to a power electronic module obtained by the above-mentioned method, comprising a metallized substrate and an active component mounted on a first face of the metallized substrate, a heat sink comprising cooling channels extending from a second face of the metallized substrate, opposite the first face.

The power electronics module may include at least one connector that is electrically connected to the metallized substrate.

The connector may be formed by a conductive member extending from the first side of the metallized substrate.

A housing portion may also extend from the first side of the metallized substrate. The metal part of the housing can be made during the electroforming step.

The invention also includes an aircraft having at least one power electronic module of the above type.

DETAILED DESCRIPTION OF THE INVENTION

FIGS. 2 to 6 schematically illustrate the various manufacturing steps of a power electronic module 1 according to one embodiment of the invention.

Figure 1:
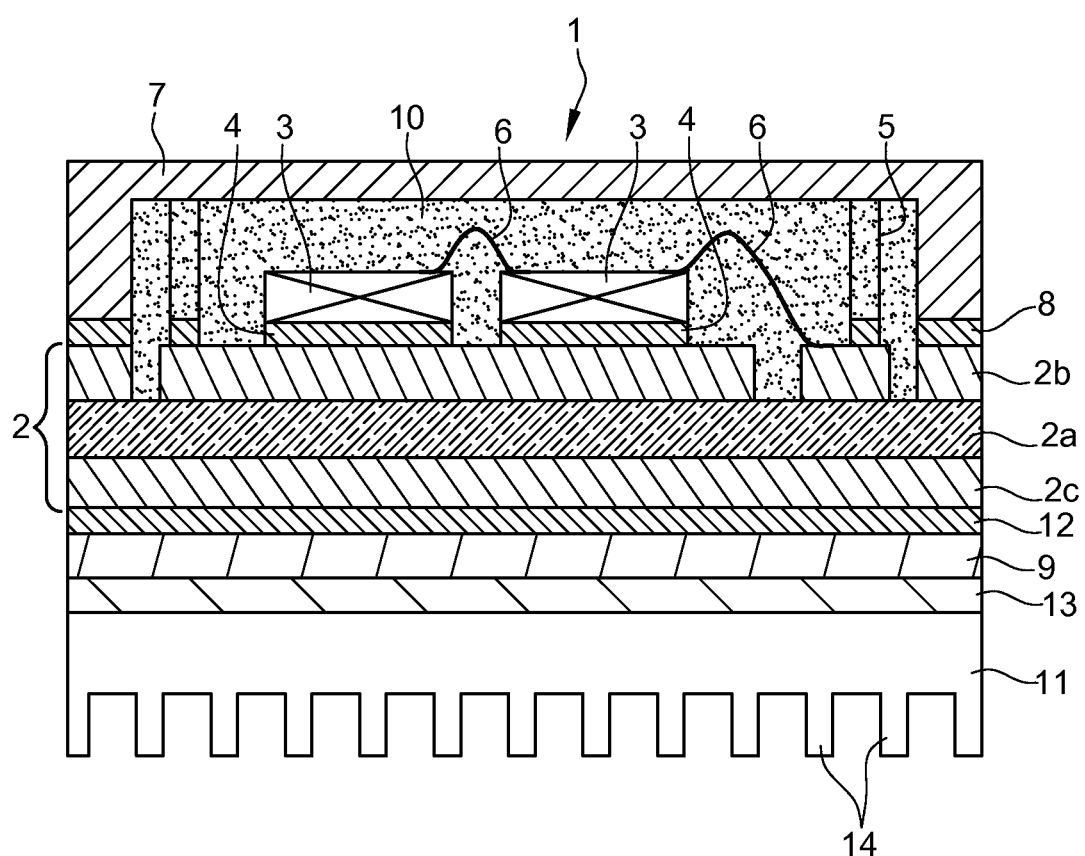
FIG. 1 is a schematic view illustrating a power electronic module of the prior art.
Figure 2:
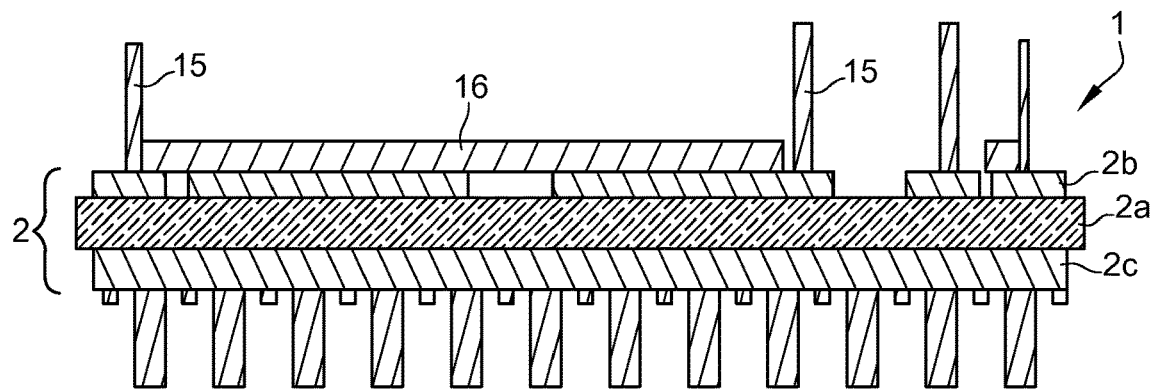
FIG. 2,
FIG. 3,
FIG. 4,
FIG. 5 and
FIG. 6 illustrate various steps of a method of manufacturing a power electronic module according to an embodiment of the invention.

In a first step illustrated in FIG. 2, preforms 15 of polymeric material are made by additive manufacturing on two opposite sides of a metallized substrate 2. The preforms 15 may be made directly on the metallized substrate 2 or may be attached to said metallized substrate 2 after the preforms 15 have been made. In the latter case, the preforms 15 may be bonded to the metallized substrate 2.

The metallized substrate 2 comprises an electrically insulating layer 2a of ceramic material coated on each of its opposite sides with a metal layer 2b, 2c, for example of copper. The metal layers 2b, 2c of the metallized substrate 2 can be joined to the insulating layer 2a by Active Metal Brazing (AMB), Direct Bonded Copper (DBC), or Direct Bonded Aluminium (DBA).

The metal layers 2b, 2c may form separate tracks from each other.

A protective film 16 of polymeric material may cover at least a portion of the conductor tracks of the top layer 2b.

Alternatively, the electrically insulating layer 2a may be made of a polymeric material (in the case of an Insulated Metal Substrate—IMS).

Figure 3:
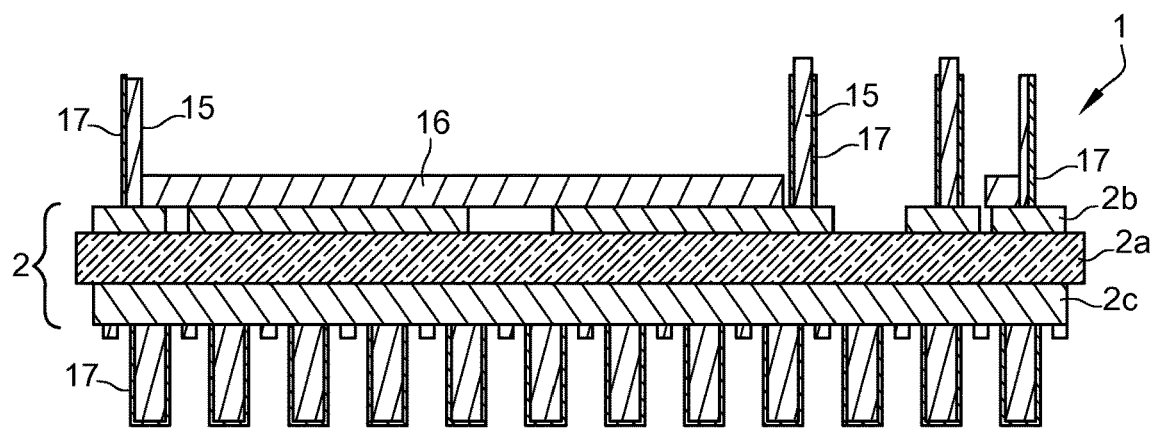

As shown in FIG. 3, a first metal layer 17, for example of copper, is then deposited on the preforms 15, for example by chemical reduction via spraying. The first layer 17 has a thickness of less than 1 micron for example.

Figure 4:
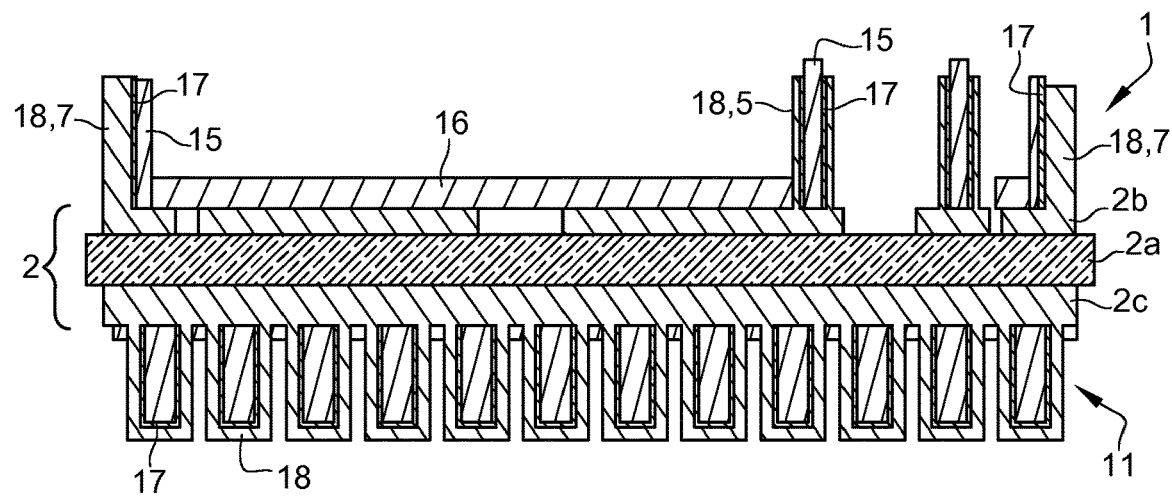

A second metal layer 18, for example copper, is then deposited on the first metal layer 17, as shown in FIG. 4. Such a deposition can be made by electroforming.

The second layer 18 may have a thickness of between a few microns and a few millimetres, as required. The thickness of the second layer 18 can be varied as a function of the applied voltage and bias time applied during the electroforming deposition step.

During electroforming, all or part of the metallized substrate 2 and the first metal layer 17 is immersed in an electrolytic bath comprising metal ions, for example copper in ionic form. The bath may be a low temperature bath, i.e. at a temperature below 100° C. An electrode is electrically connected to the first metal layer 17, an electrical potential being applied to said electrode so as to deposit the filler metal of the electrolytic bath on the first metal layer 17. The non-metallic areas of the substrate 2 that are not at electrode potential are then not covered with filler metal. According to one embodiment, at least a portion of the first metal layer 17 is covered with a protective film so as to prevent deposition of the second metal layer 18 in the covered area.

The second metal layer 17 may in particular delimit connectors 5, housing parts 7 or cooling channels 19 of a heat sink or radiator 11.

Figure 5:
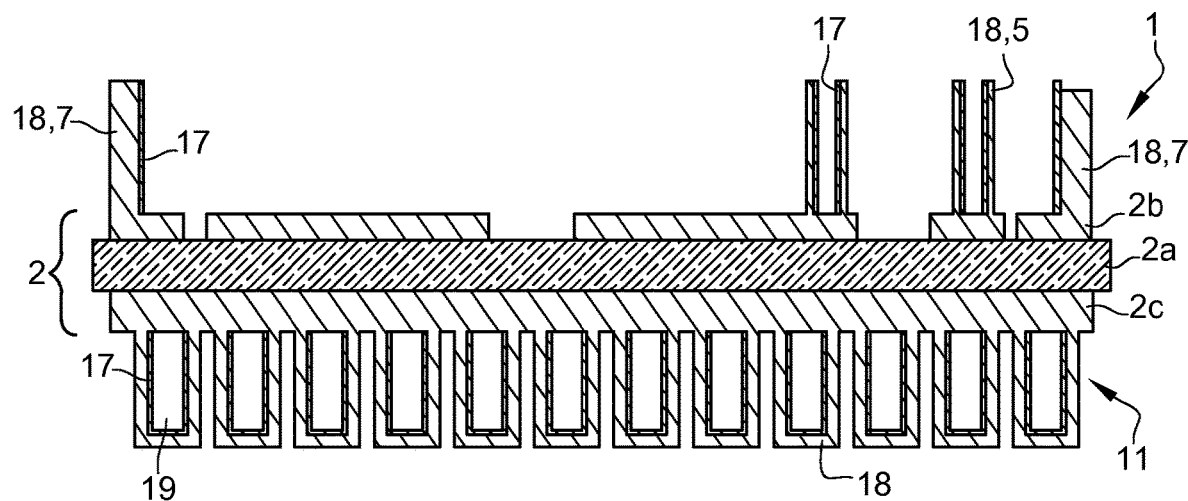

As shown in FIG. 5, the preforms 15 are then removed in a chemical or thermal dissolution step.

In the case of chemical dissolution, ABS preforms 15 can be dissolved in an acetone bath at a temperature of 50° C. using ultrasound.

Alternatively, in order to dissolve PLA preforms 15, a 35% soda bath can be used at a temperature of 60° C. and stirring can be carried out to promote dissolution.

It is thus possible to create recessed areas, connectors 5 or channels 19 intended to facilitate heat exchange for the purpose of cooling the assembly, for example by means of a flow of air or a liquid coolant.

The films 16 may also be removed in the dissolving step.

Figure 6:
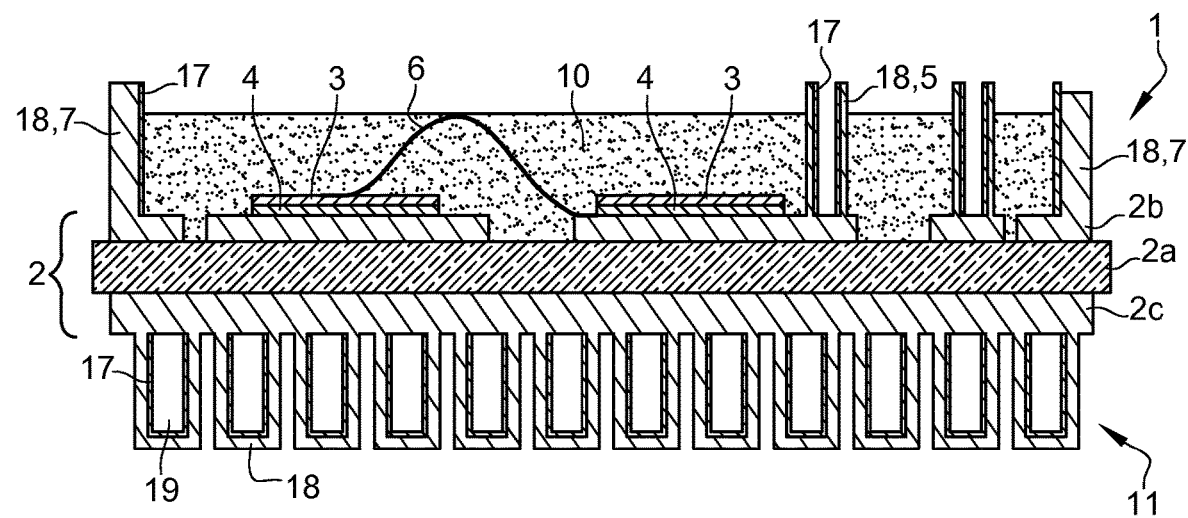

The power semiconductor components 3 are then joined to the corresponding tracks of the metallized substrate 2 via an electrical and/or mechanical interconnect joint 4, as seen in FIG. 6. The power components 3 are then electrically interconnected with each other and/or with the connectors 11 by means of wiring wires 6. The housing 7 is then filled with an electrical encapsulant or insulator 10, such as a gel or epoxy, to provide mechanical and electrical protection for the power components 3 and the wiring wires 6.

Such a process provides the following advantages:
- good thermal performance due in particular to the reduction of the interfaces between the semiconductor components 3 and the heat sink 11 and to the possibility of producing a heat sink 11 with complex geometric shapes,
- possibility of use at very high temperatures,—improvement in reliability by eliminating soldering on large surfaces,
- increase in the mass power density of the converters due to the reduction in the mass of the heat sink 11,
- reduction of the number of manufacturing steps and of the manufacturing time,
- reduction of the residual stresses compared with the same production by additive manufacturing techniques requiring very high local temperatures for the melting or sintering of metal powders,
- sealing of the channels 19 of the heat sink 11 thanks to the absence of porosity and gaps in the electro-deposited material 18,
- high precision of the electroforming, in terms of the reproducibility of the surface state. This allows a great freedom of surface texturing via the use of polymer preforms 15 with complex geometries obtained by additive manufacturing, thus strongly increasing the exchange surfaces and thus the performance in terms of thermal dissipation,
- obtaining a unitary assembly at low temperature (<80° C.) and in a single phase including several functions (heat sink 11, housing 7, connectors 5) on both sides of the metallized insulating substrate 2 without the need for additional joints.

The invention claimed is:

1. A method for manufacturing a power electronic module (1) by additive manufacturing, characterized in that it comprises the steps of:
    making or fixing preforms (15) of polymer material on at least one face of a metallized substrate (2) comprising an insulating substrate (2a) covered with at least one layer of metal (2b, 2c),
    depositing a first metal layer (17) on the preform (15),
    depositing by electroforming a second metal layer (18) on the first metal layer (17), and
    dissolving the preforms of polymeric material (15) by chemical or thermal means.

2. The method according to claim 1, characterized in that it comprises a step of assembling active components on the metallized substrate (2a).

3. The method according to claim 2, characterized in that the power electronic module (1) comprises a housing (7) in which the metallized substrate (2) and the active component (3) are housed, the method comprising a step of filling the housing, at least in part, with an electrically insulating material (10).

4. The method according to claim 2, wherein the active components are semiconductor power components (3).

5. The method according to claim 1, characterized in that it comprises a step of protecting at least one zone of the metallized substrate (2a) before deposition of the first metal layer (17).

6. The method according to claim 1, characterized in that the metallized substrate (2) comprises at least one insulating layer (2a) of ceramic.

7. The method according to claim 1, characterized in that the first metal layer (17) has a thickness of less than 5 microns.

8. The method according to claim 7, characterized in that the first metal layer (17) has a thickness of less than 1 micron.

9. A method for manufacturing a power electronic module by additive manufacturing, comprising:
    making or fixing preforms of polymer material on at least one face of a metallized substrate comprising an insulating substrate covered with at least one layer of metal,
    depositing a first metal layer on the preform,
    depositing by electroforming a second metal layer on the first metal layer,
    dissolving the preforms of polymeric material by chemical or thermal means,
    assembling active components, such as semiconductor power components, on the metallized substrate,
    attaching a housing to the metallized substrate, and
    filling the housing, at least in part, with an electrically insulating material.

10. A method according to claim 9, characterized in that it comprises a step of protecting at least one zone of the metallized substrate (2a) before deposition of the first metal layer (17).

11. A method according to claim 9, characterized in that the metallized substrate (2) comprises at least one insulating layer (2a) of ceramic.

12. The method according to claim 9, characterized in that the first metal layer (17) has a thickness of less than 5 microns.

13. The method according to claim 12, characterized in that the first metal layer (17) has a thickness of less than 1 micron.

* * * * *